(12) United States Patent
Yang

(10) Patent No.: US 12,349,465 B2
(45) Date of Patent: Jul. 1, 2025

(54) DISPLAY PANEL AND DISPLAY DEVICE

(71) Applicant: GUANGZHOU CHINA STAR OPTOELECTRONICS SEMICONDUCTOR DISPLAY TECHNOLOGY CO., LTD., Guangdong (CN)

(72) Inventor: Wenlong Yang, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,648

(22) PCT Filed: May 16, 2022

(86) PCT No.: PCT/CN2022/093011
§ 371 (c)(1),
(2) Date: May 29, 2022

(87) PCT Pub. No.: WO2023/201801
PCT Pub. Date: Oct. 26, 2023

(65) Prior Publication Data
US 2024/0162236 A1 May 16, 2024

(30) Foreign Application Priority Data
Apr. 20, 2022 (CN) .......................... 202210419510.7

(51) Int. Cl.
H01L 27/12 (2006.01)
G02F 1/1368 (2006.01)
(Continued)

(52) U.S. Cl.
CPC ........... *H10D 86/60* (2025.01); *G02F 1/1368* (2013.01); *H10D 86/421* (2025.01); *H10D 86/431* (2025.01)

(58) Field of Classification Search
CPC ............. H01L 27/1237; H01L 27/1222; G02F 1/1368; H10D 86/60; H10D 86/421;
(Continued)

(56) References Cited

U.S. PATENT DOCUMENTS

2011/0039418 A1* 2/2011 Kabe ................. H01L 21/02304
257/E21.24
2011/0092017 A1* 4/2011 Akimoto ............. H01L 29/7869
257/E21.459
(Continued)

FOREIGN PATENT DOCUMENTS

| CN | 109509793 A | 3/2019 |
|---|---|---|
| CN | 110556422 A | 12/2019 |

(Continued)

OTHER PUBLICATIONS

International Search Report in International application No. PCT/CN2022/093011,mailed on Dec. 16, 2022.
Written Opinion of the International Search Authority in International application No. PCT/CN2022/093011,mailed on Dec. 16, 2022.

*Primary Examiner* — Mohammed R Alam
(74) *Attorney, Agent, or Firm* — PV IP PC; Wei Te Chung

(57) ABSTRACT

The present application provides a display panel and a display device. The display panel includes a substrate, a gate electrode, an insulating barrier layer, and an active layer. The active layer is disposed on a side of the gate electrode away from or close to the substrate, and the insulating barrier layer is disposed between the gate electrode and the active layer;
(Continued)

wherein band gap widths of materials of the insulating barrier layer are greater than a work function of a material of the gate electrode.

18 Claims, 2 Drawing Sheets

(51) Int. Cl.
*H10D 86/40* (2025.01)
*H10D 86/60* (2025.01)

(58) Field of Classification Search
CPC ............. H10D 86/431; H10D 30/6755; H10D 30/6739; H10D 86/423
See application file for complete search history.

(56) References Cited

U.S. PATENT DOCUMENTS

| | | | | |
|---|---|---|---|---|
| 2015/0091004 A1* | 4/2015 | Kim | ................ | H01L 27/124 |
| | | | | 257/43 |
| 2020/0411647 A1* | 12/2020 | Matsuyama | ........ | H01L 29/7802 |

FOREIGN PATENT DOCUMENTS

| CN | 112420848 A | 2/2021 |
|---|---|---|
| CN | 113380896 A | 9/2021 |
| CN | 114023768 A | 2/2022 |
| JP | 2015060867 A | 3/2015 |

* cited by examiner

DISPLAY PANEL AND DISPLAY DEVICE

BACKGROUND OF INVENTION

Field of Invention

The present application relates to a field of display technology, and particularly to a display panel and a display device.

Description of Prior Art

Thin film transistors (TFTs) in TFT display panels usually include an active layer, a gate electrode, and a gate insulating layer disposed between the active layer and the gate electrode. A band gap width of a material of the gate insulating layer is usually less than a work function of the material of the gate electrode, and the band gap width of the material of the gate insulating layer will further decrease under a condition of long-term continuous operation. Therefore, the band gap width of the material of the gate insulating layer is quite different from the work function of the material of the gate electrode, resulting in a continuous transition of electrons of the gate electrode to an interface of the active layer, thereby resulting in a positive shift of threshold voltage and affecting performance of the TFTs display panels.

SUMMARY OF INVENTION

The present application provides a display panel and a display device to solve a problem of transition of electrons of a gate electrode to an active layer.

The present application provides a display panel, including:
- a substrate;
- a gate electrode disposed on the substrate;
- an insulating barrier layer disposed on the gate electrode, and band gap widths of materials of the insulating barrier layer is greater than a work function of a material of the gate electrode; and
- an active layer disposed on the insulating barrier layer.

Alternatively, in some embodiments of the present application, the material of the gate electrode includes one or more combinations of Cu, Al, Ag, Mo, Ti, Sn, and Zn, and the band gap widths of the materials of the insulating barrier layer are greater than 5.1 eV.

Alternatively, in some embodiments of the present application, the materials of the insulating barrier layer are composed of one or more combinations of diamond, aluminum nitride, and boron nitride.

Alternatively, in some embodiments of the present application, the materials of the insulating barrier layer include an atomic diffusion barrier material and an electron barrier material, the electron barrier material includes one or more combinations of diamond, aluminum nitride, and boron nitride, and the atomic diffusion barrier material includes at least one of silicon oxide and alumina.

Alternatively, in some embodiments of the present application, the insulating barrier layer is composed of a mixture of the atomic diffusion barrier material and the electron barrier material, and a mass proportion of the atomic diffusion barrier material in the materials of the insulating barrier layer ranges from 10% to 95%.

Alternatively, in some embodiments of the present application, the insulating barrier layer includes an electron barrier layer and an atomic diffusion barrier layer, the electron barrier layer and the atomic diffusion barrier layer are stacked on the gate electrode in sequence, or the atomic diffusion barrier layer and the electron barrier layer are stacked on the gate electrode in sequence, the electron barrier layer is composed of the electron barrier material, and the atomic diffusion barrier layer is composed of the atomic diffusion barrier material.

Alternatively, in some embodiments of the present application, a material of the active layer is amorphous silicon, the display panel further includes a gate insulating layer, and the gate insulating layer is disposed between the gate electrode and the insulating barrier layer, or between the insulating barrier layer and the active layer.

Alternatively, in some embodiments of the present application, a material of the active layer is oxide semiconductor, the display panel further includes a gate insulating layer, and the gate insulating layer is disposed between the insulating barrier layer and the active layer.

Alternatively, in some embodiments of the present application, the display panel further includes an ohmic contact layer and a source-drain electrode, the ohmic contact layer is disposed on the substrate, the active layer includes a semiconductor part and conducting parts disposed on both sides of the semiconductor part, and an orthographic projection of the semiconductor part on the substrate overlaps an orthographic projection of the gate electrode on the substrate, the ohmic contact layer is located on the conducting parts, and the source-drain electrode is disposed on the ohmic contact layer.

Accordingly, the present application also provides a display device, the display device includes a backlight module and a display panel, the backlight module is connected with the display panel, and the display panel includes:
- a substrate;
- a gate electrode disposed on the substrate;
- an insulating barrier layer disposed on the gate electrode, and band gap widths of materials of the insulating barrier layer is greater than a work function of a material of the gate electrode; and
- an active layer disposed on the insulating barrier layer.

Alternatively, in some embodiments of the present application, the material of the gate electrode includes one or more combinations of Cu, Al, Ag, Mo, Ti, Sn, and Zn, and the band gap widths of the materials of the insulating barrier layer are greater than 5.1 eV.

Alternatively, in some embodiments of the present application, the materials of the insulating barrier layer are composed of one or more combinations of diamond, aluminum nitride, and boron nitride.

Alternatively, in some embodiments of the present application, the materials of the insulating barrier layer include an atomic diffusion barrier material and an electron barrier material, the electron barrier material includes one or more combinations of diamond, aluminum nitride, and boron nitride, and the atomic diffusion barrier material includes at least one of silicon oxide and alumina.

Alternatively, in some embodiments of the present application, the insulating barrier layer is composed of a mixture of the atomic diffusion barrier material and the electron barrier material, and a mass proportion of the atomic diffusion barrier material in the materials of the insulating barrier layer ranges from 10% to 95%.

Alternatively, in some embodiments of the present application, the insulating barrier layer includes an electron barrier layer and an atomic diffusion barrier layer, the electron barrier layer and the atomic diffusion barrier layer are stacked on the gate electrode in sequence, or the atomic diffusion barrier layer and the electron barrier layer are stacked on the gate electrode in sequence, the electron barrier layer is composed of the electron barrier material, and the atomic diffusion barrier layer is composed of the atomic diffusion barrier material.

Alternatively, in some embodiments of the present application, a material of the active layer is amorphous silicon, the display panel further includes a gate insulating layer, and the gate insulating layer is disposed between the gate electrode and the insulating barrier layer, or between the insulating barrier layer and the active layer.

Alternatively, in some embodiments of the present application, a material of the active layer is oxide semiconductor, the display panel further includes a gate insulating layer, and the gate insulating layer is disposed between the insulating barrier layer and the active layer.

Alternatively, in some embodiments of the present application, the display panel further includes an ohmic contact layer and a source-drain electrode, the ohmic contact layer is disposed on the substrate, the active layer includes a semiconductor part and conducting parts disposed on both sides of the semiconductor part, and an orthographic projection of the semiconductor part on the substrate overlaps an orthographic projection of the gate electrode on the substrate, the ohmic contact layer is located on the conducting parts, and the source-drain electrode is disposed on the ohmic contact layer.

Alternatively, in some embodiments of the present application, wherein the display panel further comprises a color film substrate and liquid crystals, the liquid crystals are disposed on a side of the source-drain electrode away from the substrate, and the color film substrate is disposed on a side of the liquid crystals away from the substrate.

The present application provides the display panel and the display device. The display panel includes the substrate, the gate electrode, the insulating barrier layer, and the active layer, the gate electrode, the insulating barrier layer and the active layer are stacked on the substrate, and the insulating barrier layer is located between the gate electrode and the active layer; wherein the band gap widths of the materials of the insulating barrier layer are greater than the work function of the material of the gate electrode. In the present application, the insulating barrier layer is disposed between the active layer and the gate electrode, and the band gap widths of the materials of the insulating barrier layer are set to be greater than the work function of the material of the gate electrode, so as to avoid a transition of the electrons of the gate electrode to the active layer, thereby avoiding a positive shift of threshold voltage and improving performance of the display panel.

BRIEF DESCRIPTION OF DRAWINGS

In order to clearly explain technical solutions in embodiments of the present application, the following will briefly introduce drawings needed to be used in descriptions of the embodiments. It is obvious that the drawings in the following descriptions are only some embodiments of the present application. For those skilled in the art, other drawings can be obtained according to these drawings without paying creative labor.

DETAILED DESCRIPTION OF EMBODIMENTS

Technical solutions in embodiments of the present application will be described clearly and completely below in combination with attached drawings in the embodiment of the present application. Obviously, the described embodiments are only part of the embodiments of the present application, not all of the embodiments. Based on the embodiments in the present application, all other embodiments obtained by those skilled in the art without creative work belong to a scope of a protection of the present application. In addition, it should be understood that the specific embodiments described herein are only used to illustrate and explain the present application and are not used to limit the present application. In the present application, in the absence of a contrary explanation, location words used, such as "up" and "down", usually refer to up and down under actual uses or working states of devices, specifically drawing directions in the attached drawings; and words "inside" and "outside" are referred to contours of the devices. In the present application, "reaction" can be a chemical reaction or a physical reaction.

The present application provides a display panel and a display device. The display panel includes a substrate, a gate electrode, an insulating barrier layer, and an active layer. The gate electrode, the insulating barrier layer, and the active layer are stacked on the substrate, and the insulating barrier layer is located between the gate electrode and the active layer; wherein band gap widths of materials of the insulating barrier layer are greater than a work function of a material of the gate electrode.

In the present application, the insulating barrier layer is disposed between the active layer and the gate electrode, and the band gap widths of the materials of the insulating barrier layer are set to be greater than the work function of the material of the gate electrode, so as to avoid a transition of electrons of the gate electrode to the active layer, thereby avoiding a positive shift of threshold voltage and improving performance of the display panel.

Figure 1:
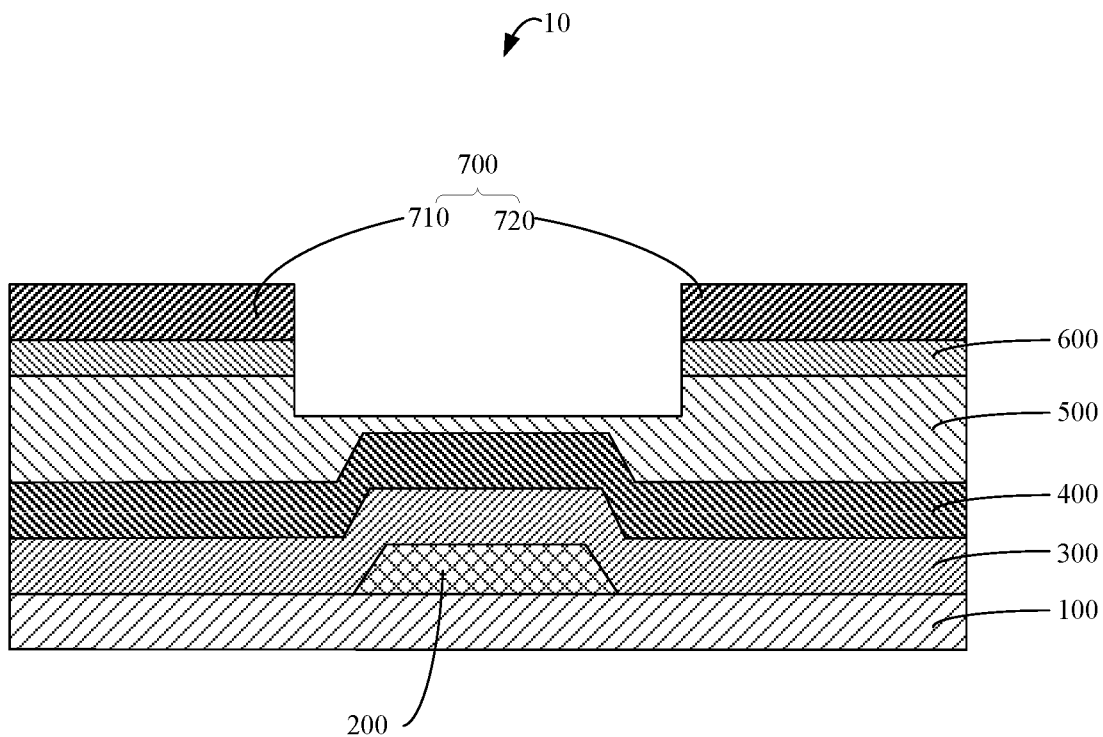
FIG. 1 is a first structural schematic diagram of a display panel provided by an embodiment of the present application.
Figure 2:
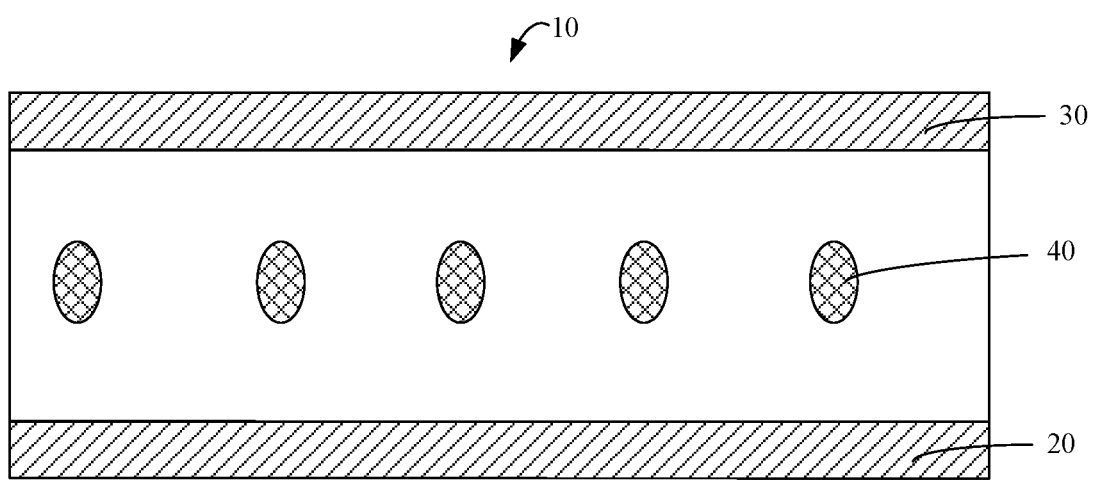
FIG. 2 is a second structural schematic diagram of a display panel provided by an embodiment of the present application.

Detailed description is as follows:

Referring to FIG. 1 and FIG. 2, the present application provides a display panel 10, the display panel 10 includes a substrate 100, a gate electrode 200, an insulating barrier layer 300, a gate insulating layer 400, an active layer 500, an ohmic contact layer 600, and a source-drain electrode 700.

The gate electrode 200 is disposed on the substrate 100. A work function of a material of the gate electrode 200 is less than 5.1 eV. Specifically, the work function of the material of the gate electrode 200 can be 3.2 eV, 3.8 eV, 4.5 eV, 4.8 eV or 5.1 eV, etc.

In an embodiment, the material of the gate electrode 200 includes one or more combinations of Cu, Al, Ag, Mo, Ti, Sn, and Zn. Wherein, a work function of Cu ranges from 4.5 eV to 5.1 eV, a work function of Al is 4.28 eV, a work function of Ag is 4.26 eV, a work function of Mo is 4.6 eV, a work function of Ti is 3.84 eV, a work function of Sn is 4.42 eV, and a work function of Zn is 4.42 eV.

The insulating barrier layer 300 is disposed on the substrate 100 and the gate electrode 200, and band gap widths Eg of materials of the insulating barrier layer 300 are greater than the work function of the material of the gate electrode 200.

The gate insulating layer 400 is disposed on the insulating barrier layer 300. A band gap width Eg of a material of the gate insulating layer 400 is less than the band gap widths Eg of the materials of the insulating barrier layer 300 and less than the work function of the material of the gate electrode 200.

In an embodiment, the band gap width Eg of the material of the gate insulating layer 400 ranges from 4.0 eV to 5.0 eV. Specifically, the band gap width Eg of the material of the gate insulating layer 400 can be 4.0 eV, 4.3 eV, 4.8 eV or 5.0 eV, etc.

In an embodiment, the material of the gate insulating layer 400 is silicon nitride. In the present application, silicon nitride is used to form the gate insulating layer 400, which can avoid an erosion of the active layer 500 by water and oxygen, so as to improve performance of the display panel 10.

In the present application, the insulating barrier layer 300 is disposed between the gate insulating layer 400 and the gate electrode 200, and the band gap widths Eg of the materials of the insulating barrier layer 300 are set to be greater than the work function of the material of the gate electrode 200, so that a potential barrier is formed between the gate electrode 200 and the active layer 500, which can avoid fracture of Si—H bonds in the silicon nitride due to a condition of a long-term continuous operation of the gate insulating layer 400 of the display panel 10. Thus, when the band gap width Eg of the gate insulating layer 400 decreases, electrons of the gate electrode 200 can be prevented from transitioning to the active layer 500, so as to avoid a positive shift of threshold voltage and a decrease of on-state current, so that the display panel 10 will not have problems of a flashing screen, a blurred screen, or uneven picture color, thereby improving the performance of the display panel 10. At a same time, by setting the insulating barrier layer 300 in the display panel 10, the insulating barrier layer 300 can form an insulating layer with the gate insulating layer 400.

In an embodiment, the insulating barrier layer 300 is a transparent insulating barrier layer. In the present application, by setting the insulating barrier layer 300 as the transparent insulating barrier layer, when the display panel 10 is applied to backlight products, a light output rate of the display panel 10 can be improved, thereby improving a display effect of the display panel 10.

In an embodiment, the band gap widths Eg of the materials of the insulating barrier layer 300 are greater than 5.1 eV. Specifically, the band gap widths Eg of the materials of the insulating barrier layer 300 can be 5.1 eV, 5.8 eV, 6.5 eV, 7.1 eV, 7.3 eV, 7.8 eV or 8.6 eV, etc.

In the present application, by setting the band gap widths Eg of the materials of the insulating barrier layer 300 to be greater than or equal to 5.1 eV, the transition of the electrons of the gate electrode 200 to the active layer 500 can be further prevented, so as to avoid the positive shift of the threshold voltage and the decrease of the on-state current, thereby improving the performance of the display panel 10.

In an embodiment, the band gap widths Eg of the materials of the insulating barrier layer 300 are greater than or equal to 5.3 eV. Specifically, the band gap widths Eg of the materials of the insulating barrier layer 300 can be 5.3 eV, 5.8 eV, 6.4 eV, 7.6 eV, 9.3 eV or 10.1 eV, etc.

In the present application, by setting the band gap widths Eg of the materials of the insulating barrier layer 300 to be greater than or equal to 5.3 eV, the transition of the electrons of the gate electrode 200 to the active layer 500 can be further prevented, so as to further avoid the positive shift of the threshold voltage and the decrease of the on-state current, thereby improving the performance of the display panel 10.

In an embodiment, the materials of the insulating barrier layer 300 is composed of an electron barrier material.

In an embodiment, the electron barrier material includes one or more combinations of diamond, aluminum nitride (AlN), and boron nitride (BN). Wherein a band gap width of diamond is 5.3 eV, a band gap width of AlN is 6.4 eV, and a band gap width of BN is 6 eV.

In another embodiment, the materials of the insulating barrier layer 300 include the electron barrier material and an atomic diffusion barrier material. That is, the insulating barrier layer 300 is formed by mixing the electron barrier material and the atomic diffusion barrier material. A band gap width of the electron barrier material and a band gap width of the atomic diffusion barrier material are greater than the work function of the material of the gate electrode 200, that is, the band gap widths of the materials of the insulating barrier layer 300 are greater than the work function of the material of the gate electrode 200.

In the present application, by adding the atomic diffusion barrier material to the materials of the insulating barrier layer 300, so that the insulating barrier layer 300 has performance of blocking water and oxygen, so that the insulating barrier layer 300 can prevent water and oxygen from eroding the active layer 500 while blocking the transition of the electrons of the gate electrode 200 to the active layer 500, so as to further improve the performance of blocking the water and oxygen of the display panel 10, thereby ensuring the display effect of the display panel 10. Meanwhile, by setting the insulating barrier layer 300 in the display panel 10, the insulating barrier layer 300 can also be used as an additional gate insulating layer to form the insulating layer with the gate insulating layer 400.

In an embodiment, a mass proportion of the atomic diffusion barrier material in the materials of the insulating barrier layer 300 ranges from 10% to 95%. Specifically, the mass proportion of the atomic diffusion barrier material in the materials of the insulating barrier layer 300 can be 10%, 15%, 20%, 25% or 30%, etc., which can improve water oxygen barrier performance of the insulating barrier layer 300 and further improve electron barrier performance of the insulating barrier layer 300, so as to further improve the performance of the display panel 10.

In another embodiment, the insulating barrier layer 300 includes a stacked electron barrier layer and an atomic diffusion barrier layer. The electron barrier layer is composed of the electron barrier material. The atomic diffusion barrier layer is composed of the atomic diffusion barrier material. The atomic diffusion barrier material includes at least one of silicon oxide and alumina. The electron barrier layer and the atomic diffusion barrier layer are stacked on the gate electrode 200 in sequence, or the atomic diffusion barrier layer and the electron barrier layer are stacked on the gate electrode 200 in sequence.

The active layer 500 is disposed on the gate insulating layer 400. The active layer 500 includes a semiconductor part and conducting parts disposed on both sides of the semiconductor part. The semiconductor part is located above the gate electrode 200.

In an embodiment, when the gate insulating layer 400 is formed from silicon nitride, the active layer 500 is a silicon-based active layer. A material of the silicon based active layer includes one of amorphous silicon (a-Si) or polycrystalline silicon. In the present application, when the gate insulating layer 400 is formed from silicon nitride, by setting the active layer 500 as the silicon-based active layer, since silicon nitride has good step coverage and high breakdown voltage, electro-static discharge (ESD) risk can be reduced, and stability of devices can be improved.

In another embodiment, the gate insulating layer 400 is disposed between the insulating barrier layer 300 and the active layer 500.

In another embodiment, the active layer 500 is an oxide active layer. A material of the oxide active layer includes indium gallium tin oxide, zinc oxide, or tin oxide, etc., which are not limited here.

In another embodiment, when the active layer 500 is the oxide active layer, the gate insulating layer 400 is an oxide gate insulating layer, such as silicon oxide gate insulating layer or alumina gate insulating layer, influence of hydrogen in the silicon nitride on the active layer 500 can be avoided, so as to improve stability of the active layer 500.

Figure 3:
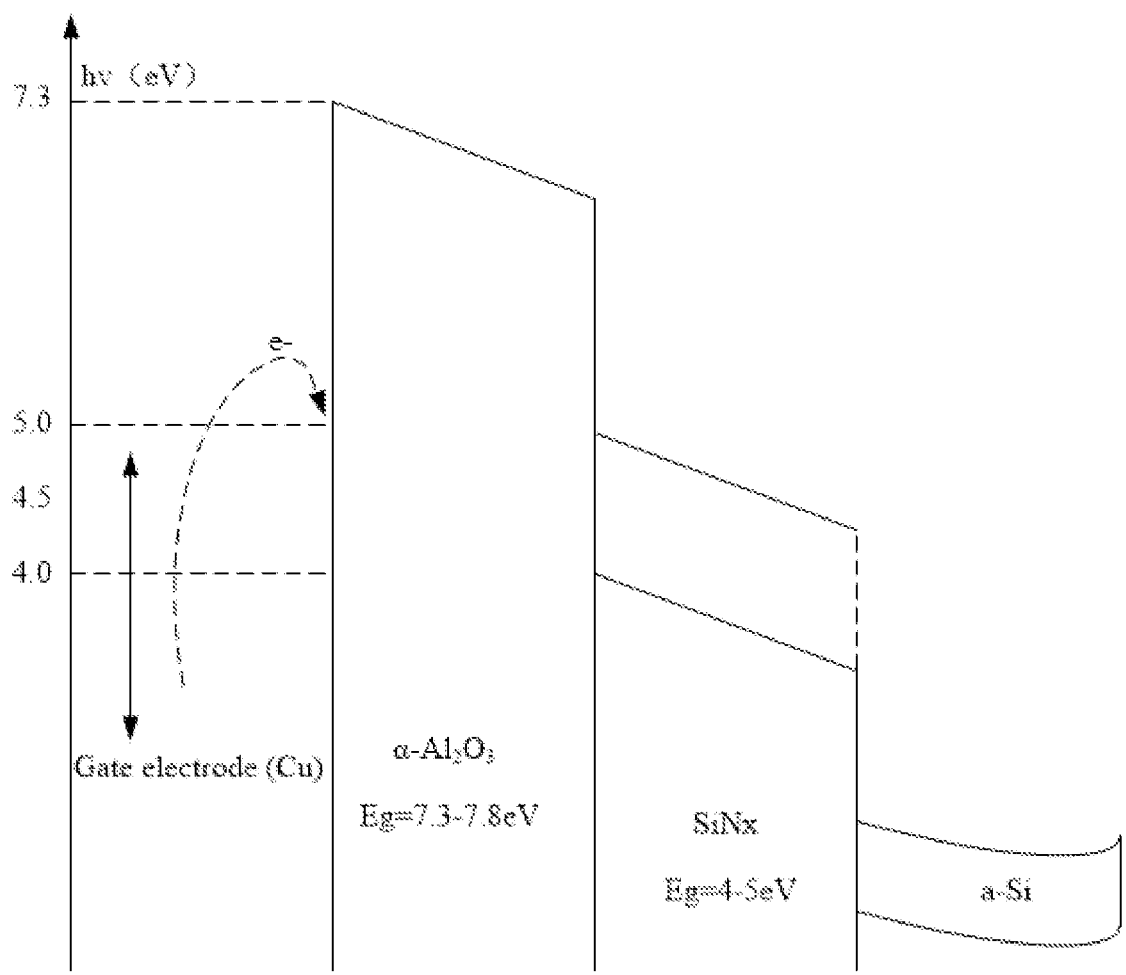
FIG. 3 is a schematic diagram of a transition of electrons between a gate electrode, an insulating barrier layer, and a gate insulating layer provided by an embodiment of the present application.

Referring to FIG. 3, as an example, the material of the gate electrode 200 is Cu, the materials of the insulating barrier layer 300 is the AlN, the material of the gate insulating layer 400 is SiNx, and the material of the active layer 500 is the a-Si. In the present application, the insulating barrier layer 300 is from AlN and the gate electrode 200 is formed from Cu, since the band gap width of AlN is greater than the work function of Cu, the transition of the electrons of the gate electrode 200 to the active layer 500 can be blocked, the positive shift of the threshold voltage can be avoided and the decrease of the on-state current can be avoided, thereby improving the performance of the display panel 10. When the display panel 10 is set in backlight products, demands of high backlight and a long-term continuous operation of the backlight products can be met.

Referring to FIG. 1, the ohmic contact layer 600 is disposed on the active layer 500. The ohmic contact layer 600 includes ohmic contact parts disposed at intervals. The ohmic contact parts are located on the conducting part of the active layer 500. A material of the ohmic contact layer 600 is N+ type a-Si. The source-drain electrode 700 includes a source 710 and a drain 720 disposed at intervals from each other. The source 710 is disposed on one of the ohmic contact parts and the drain 720 is disposed on another one of the ohmic contact parts.

The gate electrode 200, the insulating barrier layer 300, the gate insulating layer 400, the active layer 500, the ohmic contact layer 600, and the source-drain electrode 700 constitute a transistor. The transistor is a bottom gate transistor. The transistor is disposed in an array substrate 20.

In the present application, the ohmic contact layer 600 is disposed between the source-drain electrode 700 and the active layer 500, and is conducive to inputs or outputs of the electrons, so as to improve the performance of the display panel 10.

Referring to FIG. 2, in an embodiment, the display panel 10 further includes a color film substrate 30 and liquid crystals 40. The liquid crystals 40 are disposed between the color film substrate 30 and the array substrate 20.

It should be noted that the gate insulating layer 400, the ohmic contact layer 600, and the source-drain electrode 700 in the display panel 10 can be removed according to requirement of products. For example, the ohmic contact layer 600 can be not set in the display panel 10, or the gate insulating layer 400 can be not set in the display panel 10, or the source-drain electrode 700 can be not set in the display panel 10.

It should be noted that the display panel 10 provided in the present application can also be a direct type display panel.

Figure 4:
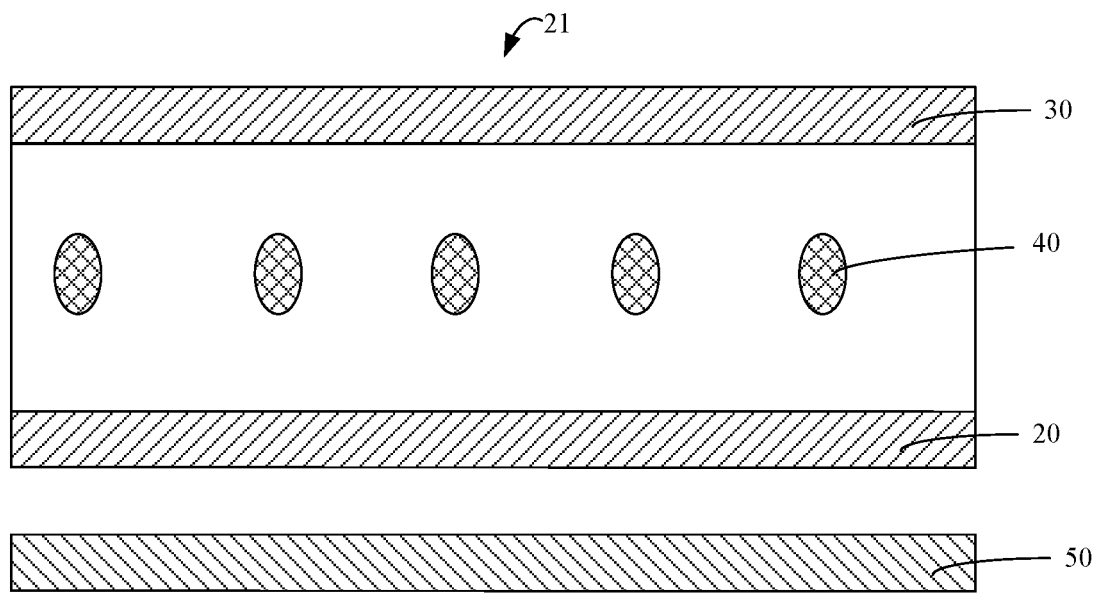
FIG. 4 is a structural schematic diagram of a display device provided in the present application.

Referring to FIG. 4, the present application also provides a display device 21. The display device 21 includes a backlight module 50 and the display panel 10 mentioned above. The backlight module 50 is connected to the display panel 10. The backlight module 50 is located on a side of the array substrate 20 away from the color film substrate 30.

The present application provides the display panel 10 and the display device 21. The insulating barrier layer 300 is disposed between the gate insulating layer 400 and the gate electrode 200, and the band gap widths Eg of the materials of the insulating barrier layer 300 are set to be greater than the work function of the material of the gate electrode 200, so as to avoid the decrease of the band gap width Eg of the gate insulating layer 400 due to the fracture of the Si—H bonds in the silicon nitride under the condition of long-term continuous operation of the gate insulating layer 400. Therefore, when the band gap width Eg of the gate insulating layer 400 decreases, the electrons of the gate electrode 200 can be prevented from transiting to the active layer 500, the positive shift of the threshold voltage is avoided and the decrease of the on-state current is avoided, thereby improving the performance of the display panel 10.

The above describes the display panel and the display device in the embodiments of the present application in detail. In this paper, specific examples are applied to explain a principle and implementation modes of the present application. The descriptions of the above embodiments are only used to help understand a method and a core idea of the present application; meanwhile, for those skilled in the art, there will be changes in the specific implementation modes and an application scope according to the idea of the present application. In conclusion, contents of the specification should not be understood as restrictions on the present application.

What is claimed is:

1. A display panel comprising:
   a substrate;
   a gate electrode disposed on the substrate;
   an insulating barrier layer disposed on the gate electrode and the substrate, wherein the insulating barrier layer comprises an electron barrier material and an atomic diffusion barrier material, the electron barrier material comprises at least one of diamond, aluminum nitride, and boron nitride, the atomic diffusion barrier material comprises at least one of silicon oxide and alumina, and a band gap width of the electron barrier material and a band gap width of the atomic diffusion barrier material of the insulating barrier layer are greater than a work function of a material of the gate electrode;
   a gate insulating layer disposed on the insulating barrier layer, wherein a material of the gate insulating layer is silicon nitride; and
   a silicon-based active layer disposed on the gate insulating layer;
   wherein the gate insulating layer is in direct contact with the silicon-based active layer.

2. The display panel according to claim 1, wherein the material of the gate electrode comprises one or more combinations of Cu, Al, Ag, Mo, Ti, Sn, and Zn, and the band gap width of the electron barrier material and the band gap width of the atomic diffusion barrier material of the insulating barrier layer are greater than 5.1 eV.

3. The display panel according to claim 2, wherein a band gap width of the material of the gate insulating layer ranges from 4.0 eV to 5.0 eV.

4. The display panel according to claim 1, wherein the insulating barrier layer is composed of a mixture of the atomic diffusion barrier material and the electron barrier material, and a mass proportion of the atomic diffusion barrier material in the insulating barrier layer ranges from 10% to 95%.

5. The display panel according to claim 1, wherein the insulating barrier layer comprises an electron barrier layer and an atomic diffusion barrier layer, the electron barrier layer and the atomic diffusion barrier layer are stacked on the gate electrode in sequence, or the atomic diffusion barrier layer and the electron barrier layer are stacked on the gate electrode in sequence, the electron barrier layer is composed of the electron barrier material, and the atomic diffusion barrier layer is composed of the atomic diffusion barrier material.

6. The display panel according to claim 1, wherein a material of the silicon-based active layer comprises amorphous silicon or polycrystalline silicon.

7. The display panel according to claim 1, wherein the display panel further comprises:
an ohmic contact layer disposed on the silicon-based active layer; and
a source-drain electrode disposed on the ohmic contact layer;
wherein the silicon-based active layer comprises a semiconductor part and conducting parts disposed on both sides of the semiconductor part, an orthographic projection of the semiconductor part on the substrate overlaps an orthographic projection of the gate electrode on the substrate, and the ohmic contact layer is located on the conducting parts.

8. A display device, wherein the display device comprises a backlight module and a display panel, the backlight module is connected with the display panel, and the display panel comprises:
a substrate;
a gate electrode disposed on the substrate;
an insulating barrier layer disposed on the gate electrode and the substrate, wherein the insulating barrier layer comprises an electron barrier material and an atomic diffusion barrier material, the electron barrier material comprises at least one of diamond, aluminum nitride, and boron nitride, the atomic diffusion barrier material comprises at least one of silicon oxide and alumina, and a band gap width of the electron barrier material and a band gap width of the atomic diffusion barrier material of the insulating barrier layer are greater than a work function of a material of the gate electrode;
a gate insulating layer disposed on the insulating barrier layer, wherein a material of the gate insulating layer is silicon nitride; and
a silicon-based active layer disposed on the gate insulating layer;
wherein the gate insulating layer is in direct contact with the silicon-based active layer.

9. The display device according to claim 8, wherein the material of the gate electrode comprises one or more combinations of Cu, Al, Ag, Mo, Ti, Sn, and Zn, and the band gap width of the electron barrier material and the band gap width of the atomic diffusion barrier material of the insulating barrier layer are greater than 5.1 eV.

10. The display device according to claim 9, wherein a band gap width of the material of the gate insulating layer ranges from 4.0 eV to 5.0 eV.

11. The display device according to claim 8, wherein the insulating barrier layer is composed of a mixture of the atomic diffusion barrier material and the electron barrier material, and a mass proportion of the atomic diffusion barrier material in the insulating barrier layer ranges from 10% to 95%.

12. The display device according to claim 8, wherein the insulating barrier layer comprises an electron barrier layer and an atomic diffusion barrier layer, the electron barrier layer and the atomic diffusion barrier layer are stacked on the gate electrode in sequence, or the atomic diffusion barrier layer and the electron barrier layer are stacked on the gate electrode in sequence, the electron barrier layer is composed of the electron barrier material, and the atomic diffusion barrier layer is composed of the atomic diffusion barrier material.

13. The display device according to claim 8, wherein a material of the silicon-based active layer comprises amorphous silicon or polycrystalline silicon.

14. The display device according to claim 8, wherein the display panel further comprises:
an ohmic contact layer disposed on the silicon-based active layer; and
a source-drain electrode disposed on the ohmic contact layer;
wherein the silicon-based active layer comprises a semiconductor part and conducting parts disposed on both sides of the semiconductor part, an orthographic projection of the semiconductor part on the substrate overlaps an orthographic projection of the gate electrode on the substrate, and the ohmic contact layer is located on the conducting parts.

15. The display panel according to claim 1, wherein a band gap width of the material of the gate insulating layer is less than the band gap width of the electron barrier material and the band gap width of the atomic diffusion barrier material of the insulating barrier layer and less than the work function of the material of the gate electrode; and
wherein the band gap width of the material of the gate insulating layer ranges from 4.0 eV to 5.0 eV, and the band gap width of the electron barrier material and the band gap width of the atomic diffusion barrier material of the insulating barrier layer are greater than or equal to 5.3 eV.

16. The display panel according to claim 1, wherein the material of the gate electrode is copper, the electron barrier material of the insulating barrier layer is aluminum nitride, and a material of the silicon-based active layer is amorphous silicon.

17. The display device according to claim 8, wherein a band gap width of the material of the gate insulating layer is less than the band gap width of the electron barrier material and the band gap width of the atomic diffusion barrier material of the insulating barrier layer and less than the work function of the material of the gate electrode; and
wherein the band gap width of the material of the gate insulating layer ranges from 4.0 eV to 5.0 eV, and the band gap width of the electron barrier material and the band gap width of the atomic diffusion barrier material of the insulating barrier layer are greater than or equal to 5.3 eV.

18. The display device according to claim 8, wherein the material of the gate electrode is copper, the electron barrier material of the insulating barrier layer is aluminum nitride, and a material of the silicon-based active layer is amorphous silicon.

* * * * *